(12) United States Patent
Dixon et al.

(10) Patent No.: US 7,129,769 B2
(45) Date of Patent: Oct. 31, 2006

(54) METHOD AND APPARATUS FOR PROTECTING EFUSE INFORMATION

(75) Inventors: Robert Christopher Dixon, Austin, TX (US); William Paul Hovis, Rochester, MN (US); Kirk Edward Morrow, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 11/060,355

(22) Filed: Feb. 17, 2005

(65) Prior Publication Data

US 2006/0181330 A1    Aug. 17, 2006

(51) Int. Cl.
*H01H 37/76* (2006.01)
(52) U.S. Cl. .................... 327/525; 365/225.7
(58) Field of Classification Search ............. 327/525, 327/526; 365/225.7
See application file for complete search history.

(56) References Cited

U.S. PATENT DOCUMENTS 6,201,750 B1 *   3/2001   Busch et al. ............. 365/225.7

* cited by examiner

*Primary Examiner*—Kenneth B. Wells
(74) *Attorney, Agent, or Firm*—Joan Pennington

(57) ABSTRACT

A method and apparatus are provided for protecting electronic fuse (eFuse) information. A current balancing circuit is provided that maintains a constant current demand on the eFuse voltage supply that is sufficient to blow an eFuse. Normally the constant current is applied to a semiconductor core. When an eFuse is being blown, the constant current is diverted away from the core to the eFuse and as the eFuse blows, the constant current is again dumped to the semiconductor core. Thus, a change in current due to the transient of the eFuse being blown is not detectable and the information that an eFuse has been blown is kept secure.

17 Claims, 1 Drawing Sheet

METHOD AND APPARATUS FOR PROTECTING EFUSE INFORMATION

FIELD OF THE INVENTION

The present invention relates generally to the semiconductor circuit design field, and more particularly, relates to a method and apparatus for protecting electronic fuse (eFuse) information.

DESCRIPTION OF THE RELATED ART

Electronic Fuses (eFuses) are currently used to configure elements after the silicon masking and fabrication process. These fuses typically are used to configure circuits for customization or to correct silicon manufacturing defects and increase manufacturing yield.

In very large scale integrated (VLSI) chips, it is common to have fuses, such as eFuses that can be programmed for various reasons. Among these reasons include invoking redundant elements in memory arrays for repairing failing locations or programming identification information.

As the use of eFuses increases, the potential use is expanding into the application area. For example, a given application may have a pool of eFuses that may be viewed as One Time Programmable memory, (OTP memory). In the case of a central processor unit (CPU) accessing the OTP memory, the memory elements are initially all not blown and a program running on the CPU may execute commands to do so.

In blowing the eFuse elements, a particular blow current is required and typically a dedicated eFuse blow voltage bias input. When a given eFuse is selected and blown, the current required to blow the eFuse can be measured at the pin used to deliver the eFuse blow voltage.

A need exists for an effective mechanism for protecting electronic fuse (eFuse) information. For example, in certain high security applications, the knowledge that an eFuse is being blown is of a security nature and should be hidden to protect the information.

SUMMARY OF THE INVENTION

Principal aspects of the present invention are to provide a method and apparatus for protecting electronic fuse (eFuse) information. Other important aspects of the present invention are to provide such method and apparatus for protecting electronic fuse (eFuse) information substantially without negative effect and that overcome many of the disadvantages of prior art arrangements.

In brief, a method and apparatus are provided for protecting electronic fuse (eFuse) information. A current balancing circuit is provided that maintains a constant current demand on the eFuse voltage supply that is sufficient to blow an eFuse. Normally the constant current is applied to a semiconductor core. When an eFuse is being blown, the constant current is diverted away from the core to the eFuse and as the eFuse blows, the constant current is again dumped to the semiconductor core. Thus, a change in current due to the transient of the eFuse being blown is not detectable and the information that an eFuse has been blown is kept secure.

A current balancing circuit includes a comparator having a non-inverting input and inverting input. A first resistor and a second resistor are respectively connected between an eFuse blow voltage rail and the respective non-inverting comparator input and inverting comparator input. A third resistor is connected in series with the second resistor between the inverting comparator input and ground. A first transistor and a second transistor are connected in series with the first resistor between the inverting comparator input and a respective one of a semiconductor core and an eFuse. An output of the comparator is applied to a gate of the first transistor. An eFuse blow program input is applied to a gate of the second transistor.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
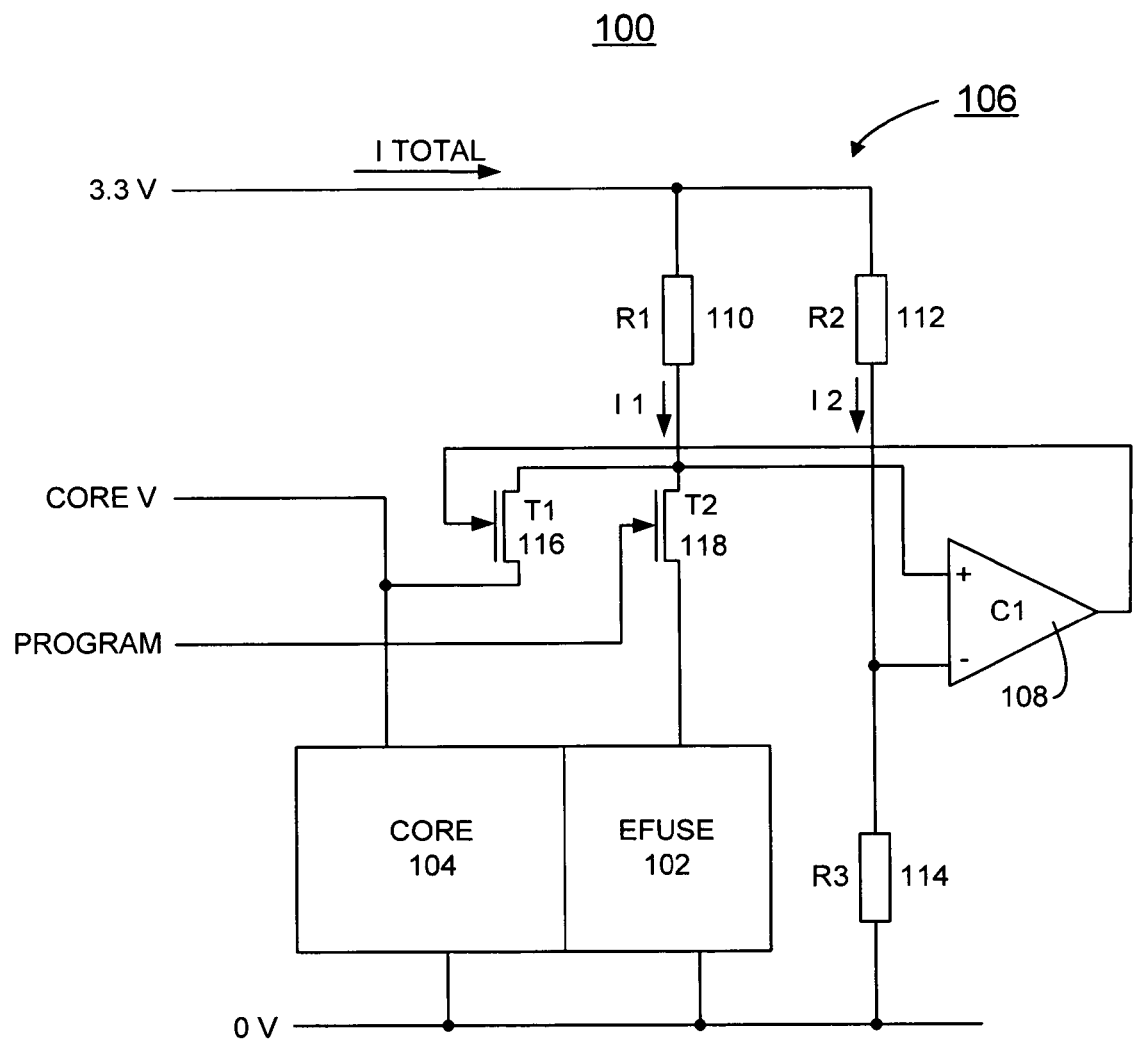
FIG. 1 is a schematic diagram illustrating apparatus for protecting electronic fuse (eFuse) information in accordance with the preferred embodiment.

Having reference now to the drawings, in FIG. 1, there is shown apparatus generally designated by the reference character 100 for protecting electronic fuse (eFuse) information in accordance with the preferred embodiment. Information protecting apparatus 100 includes an electronic fuse (eFuse) 102 having change or status information protected together with a semiconductor core 104. The eFuse 102 can include one eFuse or an eFuse logic with multiple eFuses.

The core load 104 represents a large current load relative to the eFuse blow current load. Since the core load 104 is always present and the eFuse blow current is of a transient nature, the core load can be used to present a load equivalent to the eFuse blow current when an eFuse is not being blown.

Information protecting apparatus 100 includes an exemplary current balancing circuit generally designated by the reference character 106 that maintains a constant current demand on the eFuse voltage supply pin labeled 3.3 V that is large enough to blow an eFuse. When the eFuse 102 is being blown, current is diverted away from the core 104 to the eFuse 102 and as the eFuse blows, current is again dumped to the core 104. In this way, the change in current due to the transient of the eFuse 102 being blown is not detectable and the information that an eFuse has been blown is kept secure.

It should be understood that the present invention is not limited to the illustrated current balancing circuit 106. Various other current balancing arrangements could be employed within the spirit and scope of the present invention.

Current balancing circuit 106 includes a comparator C1, 108 having a non-inverting+input connected to a resistor R1, 110, and an inverting−input connected to a resistor R2, 112. Resistor R1, 110, and resistor R2, 112 are connected to an eFuse blow voltage rail labeled 3.3 V. A resistor R3, 114 is connected between resistor R2, 112 and a ground potential labeled 0 V. Current balancing circuit 106 includes a first transistor T1, 116 having a gate input connected to an output of comparator C1, 108 and a second transistor T2, 118 having a gate input connected to an eFuse blow program input labeled PROGRAM. Transistor T1, 116 and transistor T2, 118 are connected to the junction connection of resistor R1, 110 and the non-inverting+input of the comparator C1, 108 with transistor T1, 116 connected to a core rail voltage labeled CORE V and transistor T2, 118 connected to the eFuse 102.

Core 104, such as typical semiconductor cores, runs at the core voltage CORE V which is significantly less than the eFuse blow voltage, for example, 3.3 V as shown.

In the current balancing circuit 106, comparator C1, 108 compares voltage drop across resistor R1, 110 with the voltage drop across resistor R2, 112. The current through Resistor R2, 112, and resistor R3, 114 can be set to match the eFuse blow current by applying Ohm's law and selecting resistance values accordingly. Resistor R1, 110, and resistor R2, 112 have substantially equal resistance so that these resistors both see the same voltage drop when the same amount of current is driven through each.

With transistor T2, 118 off, the non-inverting input of comparator C1, 108 will initially see a greater voltage than the inverting input of comparator C1 since there is less voltage drop across resistor R1, 110 than resistor R2, 112. This causes the comparator output to go high turning transistor T1, 116 on, as transistor T1 turns on current flows through resistor R1, 110, causing a voltage drop across resistor R1, 110. When the voltages at both inputs of the comparator C1, 108 are equal, an initial stable condition is reached with equal voltage drop across and equal current flow through resistor R1, 110, and resistor R2, 112.

When the program pin PROGRAM is asserted, transistor T2, 118 starts to turn on in order to blow the eFuse 102, such as a selected eFuse in eFuse logic, the current through resistor R1, 110 will increase causing a greater voltage drop across resistor R1. Comparator C1, 108 senses the voltage drop at its non-inverting input and reduces the current flowing in transistor T1, 116 accordingly. The result is a relatively constant current flowing in resistor R1, 110 independent of any eFuse programming activity.

That is, I total=I1+I2. I2=3.3/(R2+R3) and is a constant. The comparator C1, 108 keeps I1=I2, giving I total=2*3.3/(R2+R3). This constant current hides information as to when eFuses 102 are blown if an attempt is made to measure the total drawn from the 3.3V supply expecting to see eFuse blowing current.

When a given eFuse 102 is to be blown, the program input PROGRAM is asserted turning on transistor T2, 118 in order to blow the selected eFuse 102. As the eFuse 102 blows and the current through transistor T2, 118 decreases, comparator C1, 108 acts to maintain a constant current via transistor T1, 116. The current shunted by transistor T1, 116 is diverted to the core 104 to return via a common ground point.

The value of current I2 should be set at some current value equal to the current required to blow an eFuse 102 plus some margin. Also, resistor R1, 110 should be sized to ensure that the voltage drop across resistor R1 is small enough to keep the bias across transistor T1, 116 from reversing and that transistor T1, 116 is always operating in saturation to ensure proper small signal effects. That is the voltage at the junction connection of transistor T1, 116 and resistor R1, 110 is always greater than Core V+Vdsat for the transistor T1, 116.

It should be understood that comparator C1, 108 generates an analog difference voltage via its internal control loop in order to control transistor T1, 116 in an analog fashion. It should be understood that the 3.3 V input eFuse blowing power for the eFuse macro optionally is presented only when required to blow eFuses and the current balancing circuit 106 continues to operate to protect eFuse blowing information.

While the present invention has been described with reference to the details of the embodiments of the invention shown in the drawing, these details are not intended to limit the scope of the invention as claimed in the appended claims.

What is claimed is:

1. A method for protecting electronic fuse (eFuse) information comprising the steps of:
providing a current balancing circuit for maintaining a constant current demand on a voltage supply of an eFuse; said constant current being sufficient to blow the eFuse;
applying the constant current to a semiconductor core;
diverting the constant current away from the semiconductor core to the eFuse when the eFuse is being blown; and
applying the constant current to the semiconductor core after the eFuse blows, whereby a change in current when the eFuse being blown is not detectable and the information that the eFuse has been blown is kept secure.

2. A method for protecting electronic fuse (eFuse) information as recited in claim 1 wherein the step of providing a current balancing circuit for maintaining a constant current demand on the eFuse voltage supply includes the steps of establishing a substantially equal current flow through a pair of parallel resistors; and connecting a first transistor and a second transistor in series with one of said pair of parallel resistors and a respective one of the semiconductor core and the eFuse.

3. A method for protecting electronic fuse (eFuse) information as recited in claim 2 wherein the step of applying the constant current to a semiconductor core includes the step of activating the first transistor during normal operations when the eFuse is not being blown.

4. A method for protecting electronic fuse (eFuse) information as recited in claim 3 further including the step of activating the second transistor when the eFuse is being blown.

5. A method for protecting electronic fuse (eFuse) information as recited in claim 3 further including the steps of providing a comparator having a non-inverting input and inverting input; respectively connecting the first resistor and the second resistor between a blow voltage rail of the eFuse and the respective non-inverting comparator input and inverting comparator input; and connecting an output of the comparator to a gate of the first transistor.

6. A method for protecting electronic fuse (eFuse) information as recited in claim 3 further including the step of applying an eFuse blow program input to a gate of the second transistor.

7. Apparatus for protecting electronic fuse (eFuse) information comprising:
a current balancing circuit including a comparator having a non-inverting input and inverting input;
a first resistor and a second resistor being respectively connected between an eFuse blow voltage rail and the respective non-inverting comparator input and inverting comparator input;
a third resistor being connected in series with the second resistor between the inverting comparator input and ground;
a first transistor and a second transistor being connected in series with the first resistor between the inverting comparator input and a respective one of a semiconductor core and an eFuse;
an output of the comparator being applied to a gate of the first transistor; and
an eFuse blow program input being applied to a gate of the second transistor.

8. Apparatus for protecting electronic fuse (eFuse) information as recited in claim 7 wherein said first resistor and said second resistor have substantially equal resistance.

9. Apparatus for protecting electronic fuse (eFuse) information as recited in claim 7 wherein said first resistor and said second resistor have substantially equal voltage drop with matching current flow.

10. Apparatus for protecting electronic fuse (eFuse) information as recited in claim 8 wherein said comparator provides said output to maintain matching current flow through said first transistor to the semiconductor core during normal operations when the eFuse is not being blown with said second transistor turned off.

11. Apparatus for protecting electronic fuse (eFuse) information as recited in claim 8 wherein said comparator provides said output for reducing current flow through said first transistor when the eFuse is being blown by said eFuse blow program input activating said second transistor.

12. Apparatus for protecting electronic fuse (eFuse) information comprising:
   a current balancing circuit for maintaining a constant current demand on a voltage supply of the eFuse; said constant current being sufficient to blow an eFuse;
   a first transistor coupled between said current balancing circuit and a semiconductor core for applying the constant current to the semiconductor core during normal operations when the eFuse is not being blown;
   a second transistor coupled between said current balancing circuit and an eFuse for diverting the constant current away from the semiconductor core to the eFuse when the eFuse is being blown; and
   said first transistor for applying the constant current to the semiconductor core after the eFuse blows, whereby a change in current when the eFuse being blown is not detectable and the information that an eFuse has been blown is kept secure.

13. Apparatus for protecting electronic fuse (eFuse) information as recited in claim 12 wherein said current balancing circuit includes a comparator having a non-inverting input and inverting input.

14. Apparatus for protecting electronic fuse (eFuse) information as recited in claim 13 wherein said current balancing circuit includes a first resistor and a second resistor being respectively connected between an eFuse blow voltage rail and the respective non-inverting comparator input and inverting comparator input.

15. Apparatus for protecting electronic fuse (eFuse) information as recited in claim 14 wherein said current balancing circuit includes a third resistor being connected in series with the second resistor between the inverting comparator input and ground.

16. Apparatus for protecting electronic fuse (eFuse) information as recited in claim 15 wherein said first transistor and second transistor are connected in series with the first resistor between the inverting comparator input and a respective one of the semiconductor core and the eFuse.

17. Apparatus for protecting electronic fuse (eFuse) information as recited in claim 14 wherein said first resistor and said second resistor have substantially equal resistance.

* * * * *